(12) United States Patent
Simpson et al.

(10) Patent No.: US 6,686,282 B1
(45) Date of Patent: Feb. 3, 2004

(54) PLATED METAL TRANSISTOR GATE AND METHOD OF FORMATION

(75) Inventors: Cindy Simpson, Austin, TX (US); Hsing H. Tseng, Austin, TX (US); Olubunmi O. Adetutu, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/403,967

(22) Filed: Mar. 31, 2003

(51) Int. Cl.⁷ .......................... H01L 21/44; H01L 23/48
(52) U.S. Cl. .................. 438/685; 438/648; 438/656; 438/683; 438/686; 257/750; 257/761; 257/763; 257/764
(58) Field of Search ................................ 438/642, 643, 438/648, 649, 650, 651, 652, 656, 674, 677, 678, 679, 683, 685, 686; 257/412, 741, 750, 751, 757, 758, 761, 763, 764, 768, 769, 770

(56) References Cited

U.S. PATENT DOCUMENTS

| | | | |
|---|---|---|---|
| 5,960,270 A | 9/1999 | Misra | |
| 6,187,670 B1 * | 2/2001 | Brown et al. | ................ 438/638 |
| 6,300,203 B1 | 10/2001 | Buynoski | |
| 6,316,359 B1 * | 11/2001 | Simpson | .............. 257/E21.584 |
| 6,333,247 B1 | 12/2001 | Chan | |
| 6,344,410 B1 * | 2/2002 | Lopatin et al. | ............. 438/652 |
| 6,368,961 B1 * | 4/2002 | Lopatin et al. | ...... 257/E21.584 |
| 6,423,619 B1 | 7/2002 | Grant | |
| 2002/0042183 A1 | 4/2002 | Chan | |
| 2002/0081810 A1 | 6/2002 | Mun | |

* cited by examiner

Primary Examiner—Kevin M. Picardat
(74) Attorney, Agent, or Firm—James L. Clingan, Jr.; Robert L. King

(57) ABSTRACT

Using plating, metal gates for N channel and P channel transistors are formed of different materials to achieve the appropriate work function for these N and P channel transistors. The plating is achieved with a seed layer consistent with the growth of the desired layer. The preferred materials are selected from the platinum metals, which comprise ruthenium, ruthenium oxide, iridium, palladium, platinum, nickel, osmium, and cobalt. These are attractive metals because they are relatively high conductivity, can be plated, and provide a good choice of work functions for forming P and N channel transistors.

30 Claims, 8 Drawing Sheets

# PLATED METAL TRANSISTOR GATE AND METHOD OF FORMATION

FIELD OF THE INVENTION

This invention relates to making integrated circuits having metal gates, and more particularly to forming them by plating.

RELATED ART

As semiconductor devices continue to scale down in geometry, the conventional polysilicon gate is becoming inadequate. One problem is relatively high resistivity and another is depletion of charge near the interface between the polysilicon gate and gate dielectric. To overcome these deficiencies of polysilicon, metal gates are being pursued as an alternative. The deposition of metal gates, however, has also presented problems. One technique for the deposition is physical vapor deposition (PVD), but this technique results in plasma induced damage to the gate dielectric. Chemical vapor deposition (CVD) is another technique but that tends to result in impurities in the gate dielectric that cause degradation of the quality of the gate dielectric. A resulting problem is increased current leakage through the gate dielectric. Plasma enhanced chemical vapor deposition (PECVD) is another alternative, but it also causes the plasma damage in the manner that PVD does.

Thus, there is a need for a technique of forming metal gates in which the technique is manufacturable and avoids the problems associated with PVD, CVD, and PECVD.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Metal gates for N channel and P channel transistors are formed of different materials to achieve the appropriate work function for each using plating. The plating is achieved with a seed layer consistent with the growth of the desired layer. The preferred materials are selected from the platinum metals, which comprise ruthenium, ruthenium oxide, iridium, palladium, platinum, nickel, osmium, and cobalt. These are attractive metals because they have relatively high conductivity, can be plated, and provide a good choice of work functions for forming P and N channel transistors. The invention is better understood by reference to the drawings and the following description.

Figure 1:
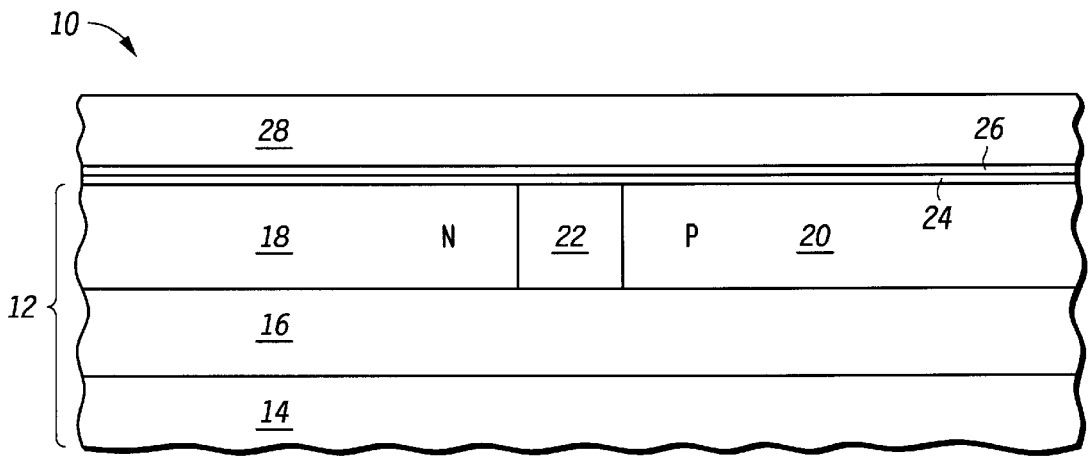
FIGS. 1–9 are cross sections of a semiconductor device according to a first embodiment of the invention at sequential stages in processing.

Shown in FIG. 1 is a semiconductor device 10 comprising a silicon on insulator (SOI) substrate 12, a gate dielectric 24, a metal seed layer 26, and a plated metal layer 28. Plated layer 28 is formed by plating, which involves application of a liquid in which metal is reduced onto the surface of the semiconductor device. This can be achieved by either autocatalytic or electrolytic action. The autocatalytic approach is also called electroless plating. Plated layer 28 can be any convenient thickness, but preferably 50 Angstroms. It can be thicker or thinner but should be thick enough to be deterministic of the work function for the ultimately formed transistor as well as be able to carry a charge in the case of electrolytic plating. SOI substrate 12 comprises a silicon substrate 14, an insulator layer 16, a semiconductor region 18 of N type over insulator layer 16, a semiconductor region 20 of P type over insulator layer 16 and laterally adjacent to semiconductor region 18, and an isolation region 22 between semiconductor regions 18 and 20. The material for plated metal layer 28 is chosen to have an appropriate work function for an N channel transistor. N channel transistors are formed in P regions such as P region 20.

The optimum work function for N channel transistor gates and P channel transistor gates is generally considered to be at the silicon energy band edges, i.e., 4.1 electron volts (eV) and 5.2 eV, respectively. This is true for both bulk silicon and for partially depleted SOI. In practice this may be difficult to achieve, but preferably the N channel metal gate should have a work function of less than or equal to 4.4 eV and the P channel metal gate should have a work function of more than 4.6 eV for a partially depleted SOI substrate or bulk semiconductor substrate, which is the present case. The material for plated metal layer 28 is thus chosen to have a work function as close to 4.1 eV as is practical after all processing relating to it has occurred. This may be closer to 4.4 eV than 4.1 eV in practice. This can be achieved by any of the platinum metals with suitable additional dopants that come about from the processing of the semiconductor device 10.

The SOI substrate 12 is conventional for SOI and can be replaced by just a silicon substrate having N and P wells that are isolated from each other. Also the silicon can be replaced by an alternative semiconductor such as, for example, germanium and silicon/germanium. Isolation region 22 is preferably silicon oxide but could be an alternative insulator. Seed layer 26 can be any of the platinum family metals or any like metal, and although the method of deposition may be by any suitable method, PVD is preferred in most situations. The seed layer is preferably, but need not be, of the same metal as the plated layer. The thickness of seed layer 26 is chosen to be as thin as possible, but if electroplating is to be performed, it must be of sufficient thickness to carry the current that is being used in the electroplating. Seed layer may not be visible as a separate layer after formation of plated layer 28, which formation has the effect of merging the plated layer with the seed layer. Gate dielectric may be any dielectric suitable as a dielectric for a gate such as, for example, conventional silicon oxide or a high K dielectric.

Figure 2:
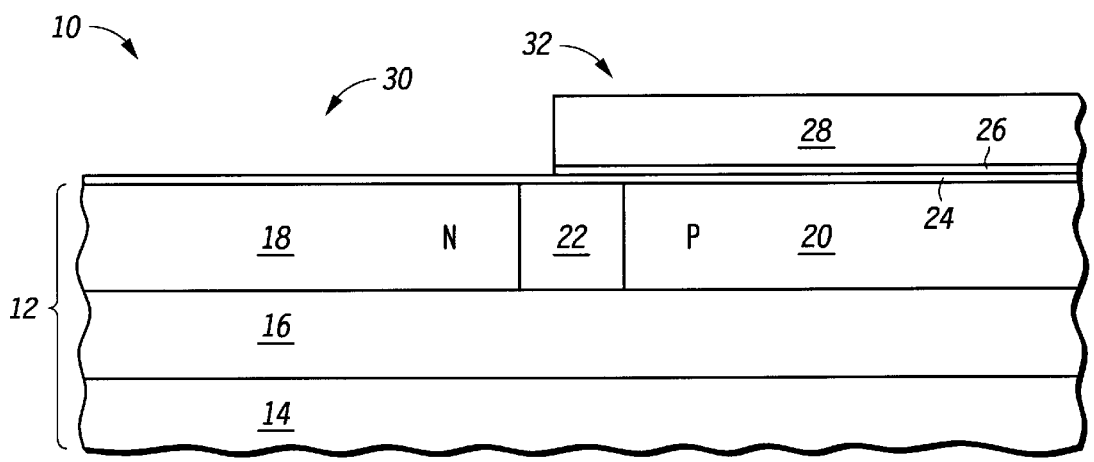

Shown in FIG. 2 is device 10 after patterning plated layer 28 to leave plated layer 28 over a P region 32, the area over P region 20, and removed from N region 18. This is achieved by any patterning technique such as applying photoresist, exposing the photoresist, and removing the exposed photoresist.

Figure 3:
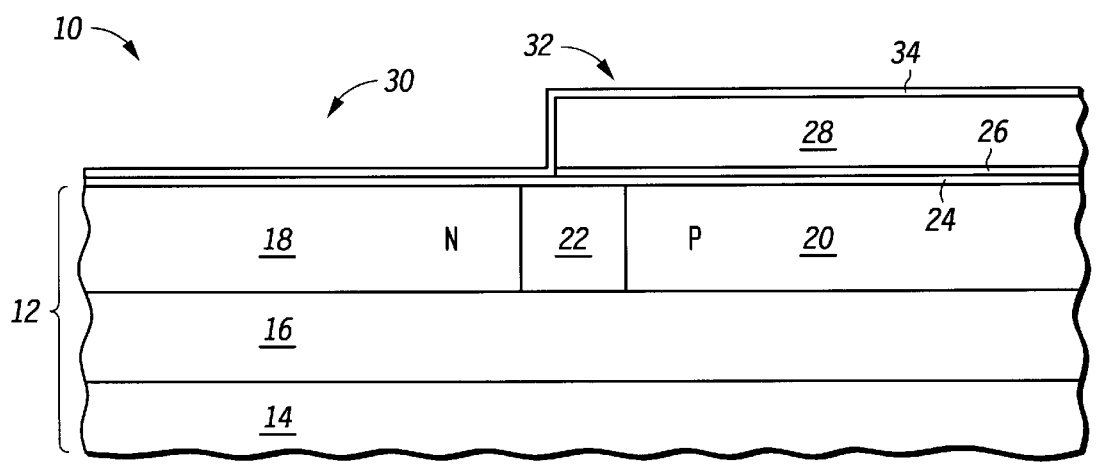

Shown in FIG. 3 is device 10 after formation of seed layer 34 over N region 18 and plated layer 28. Seed layer 34 is chosen under the same considerations as for seed layer 26.

Figure 4:
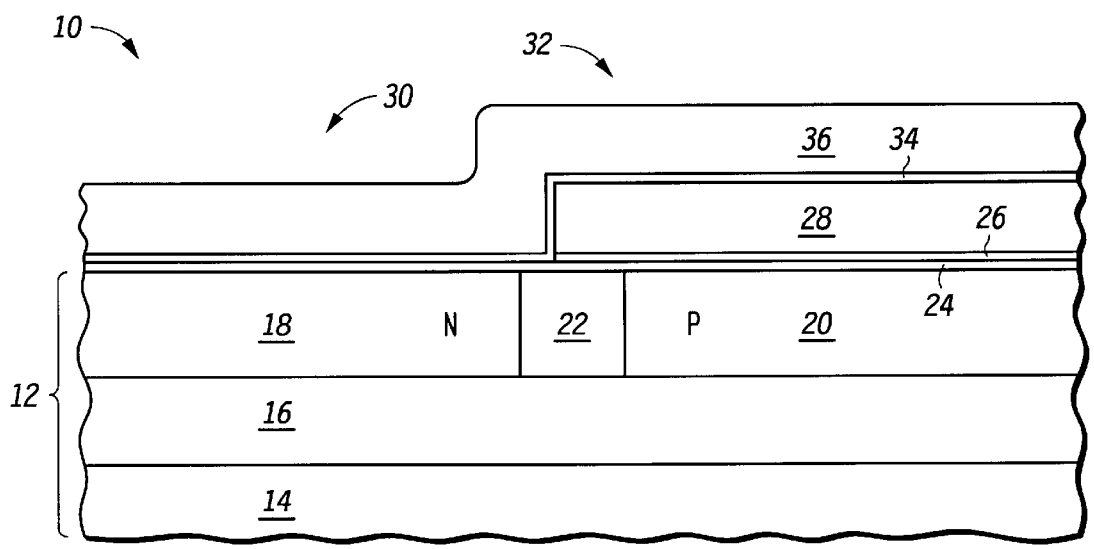

Shown in FIG. 4 is device 10 after formation of plated layer 36 over seed layer 34. Plated layer, 36 which is substantially the same thickness as plated layer 28, is chosen for an appropriate work function for a P channel transistor, which is as close to 5.2 eV as is practical. This can be any of the platinum metals as determined by the subsequent doping that effects the work function. The particular process chosen will effect how close to the optimum the resulting work function is.

Figure 5:
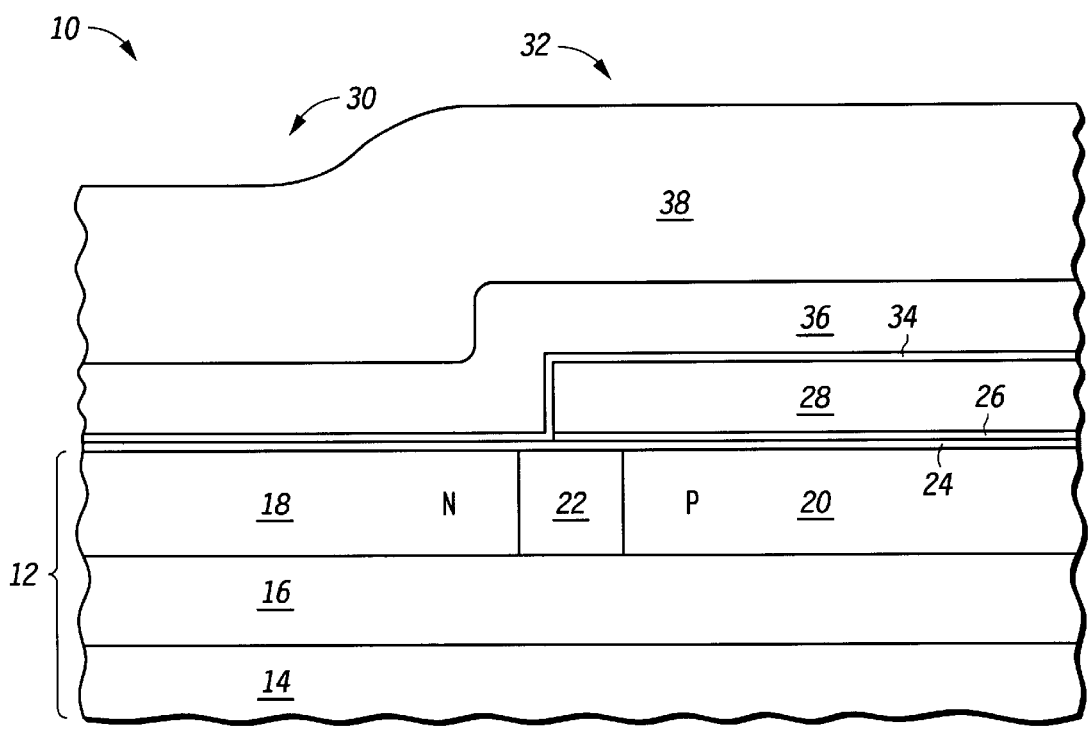

Shown in FIG. 5 is device 10 after deposition of an electrode layer 38, which is preferably polysilicon, but may also be other materials. One material alternative is tungsten. As polysilicon, electrode layer 38 preferably has a thickness of 1000 Angstroms.

Figure 6:
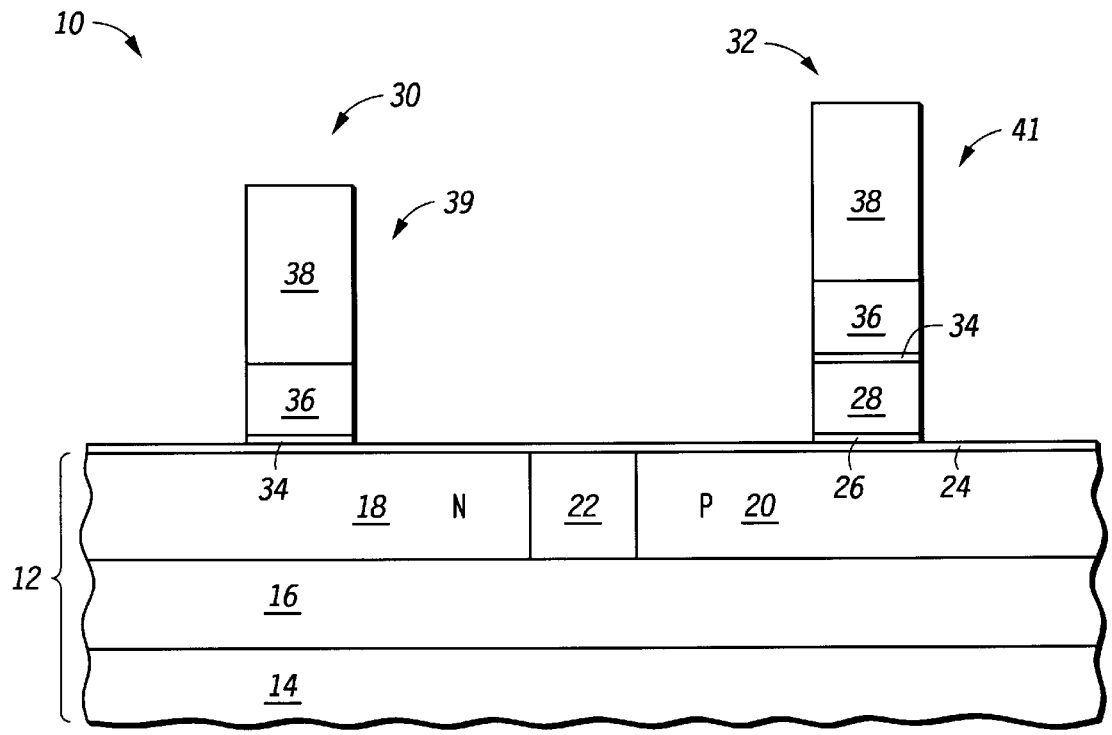

Shown in FIG. 6 is device 10 after patterning plated layers 28 and 36 and electrode layer 38. This leaves a gate stack 39 over N region 18 of portions of plated layer 36 and electrode layer and a gate stack 41 over P region 20 of portions of plated layers 28 and 36 and electrode layer 38. Due to gate stack 41 having a portion of plated layer 28, gate stack 41 is higher than gate stack 39.

Figure 7:
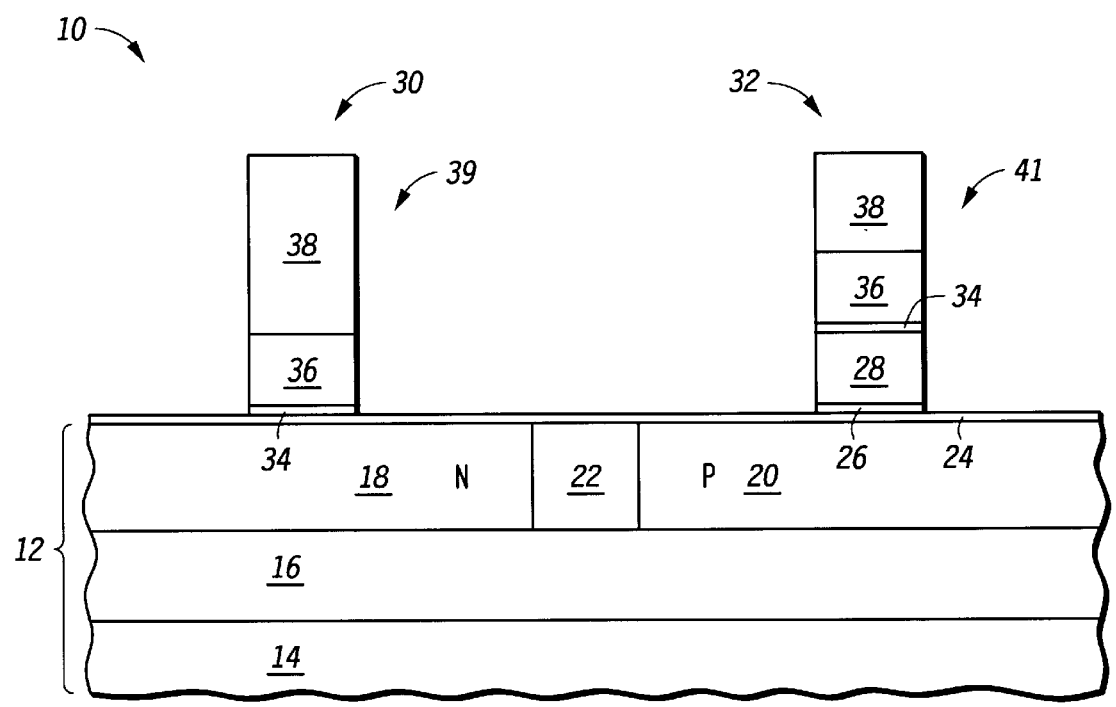

Shown in FIG. 7 is device 10 after shortening gate stack 41 to the same height as gate stack 39. This can be achieved by known techniques such as chemical mechanical polishing or fill and etch back. This step is optional because the stack height differential is for transistors of different types so that they are expected to have different characteristics. The consequences of different stack height may not have any or only minimal detrimental effect on circuit designs so the additional processing to achieve the same stack height may not be worth doing.

Figure 8:
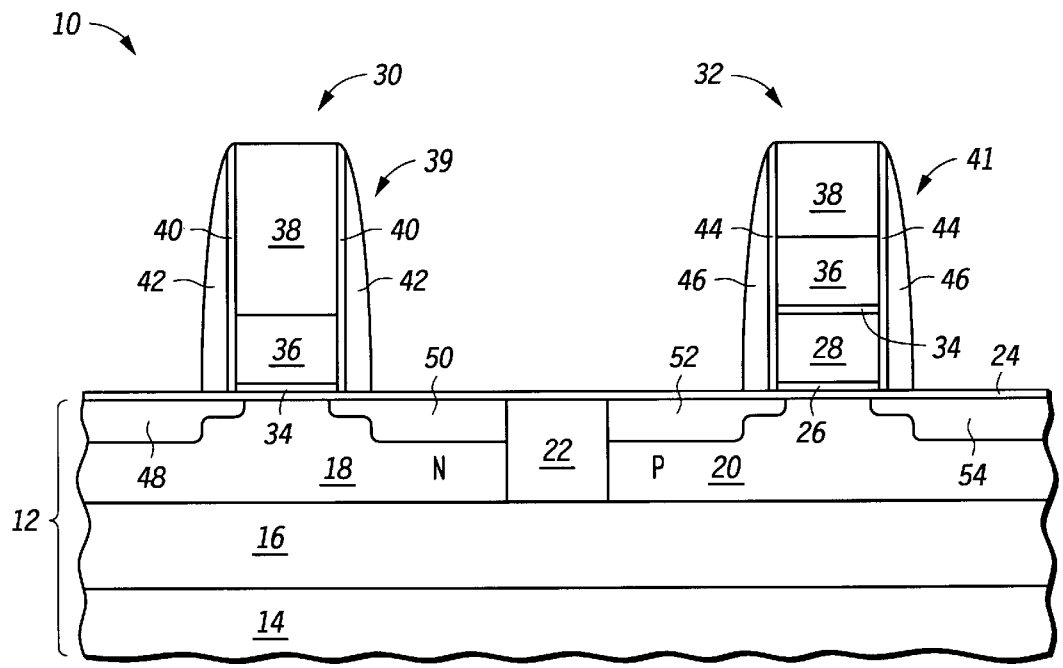

Shown in FIG. 8 is device 10 after a P channel transistor and an N channel transistor have been formed using gate stacks 39 and 41, respectively. N channel transistor comprises a source/drain 48 and a source/drain 50 formed in N region 18 and a sidewall spacer 42 separated from gate stack 39 by a liner 40. Liner 40 is to prevent the oxidation of gate stack 39 when exposed to ambient. This liner may not be necessary if an situ process is used which prevents the sidewall from being exposed to ambient conditions. The N channel transistor similarly has source/drains 52 and 54, sidewall spacer 46, and liner 44.

Figure 9:
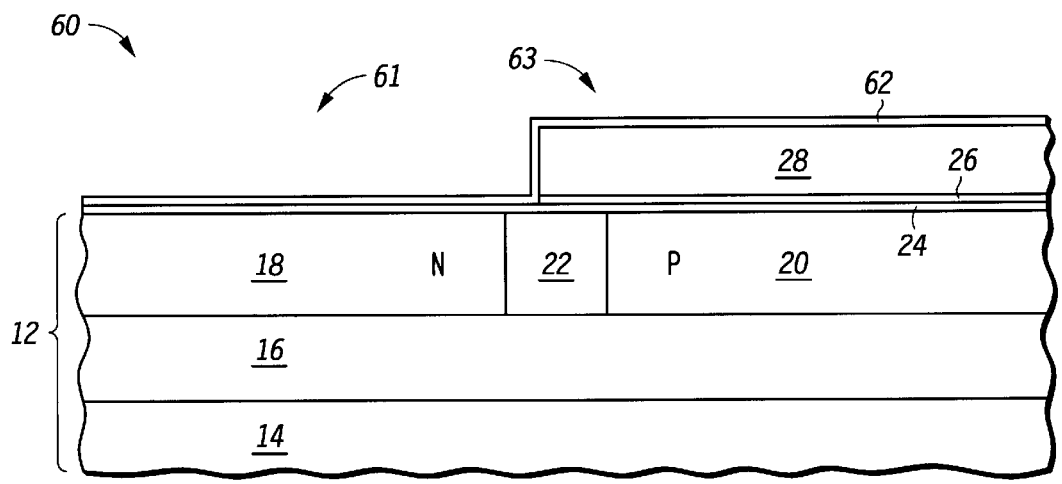

Shown in FIG. 9 is a device 60 formed subsequent to a device structure as shown in FIG. 2 and very similar to the device structure of FIG. 3. The same numbers are used for the same structures. As similar to seed layer 34 of FIG. 3, seed layer 62 is deposited over N region 18 and plated layer 28.

Figure 10:
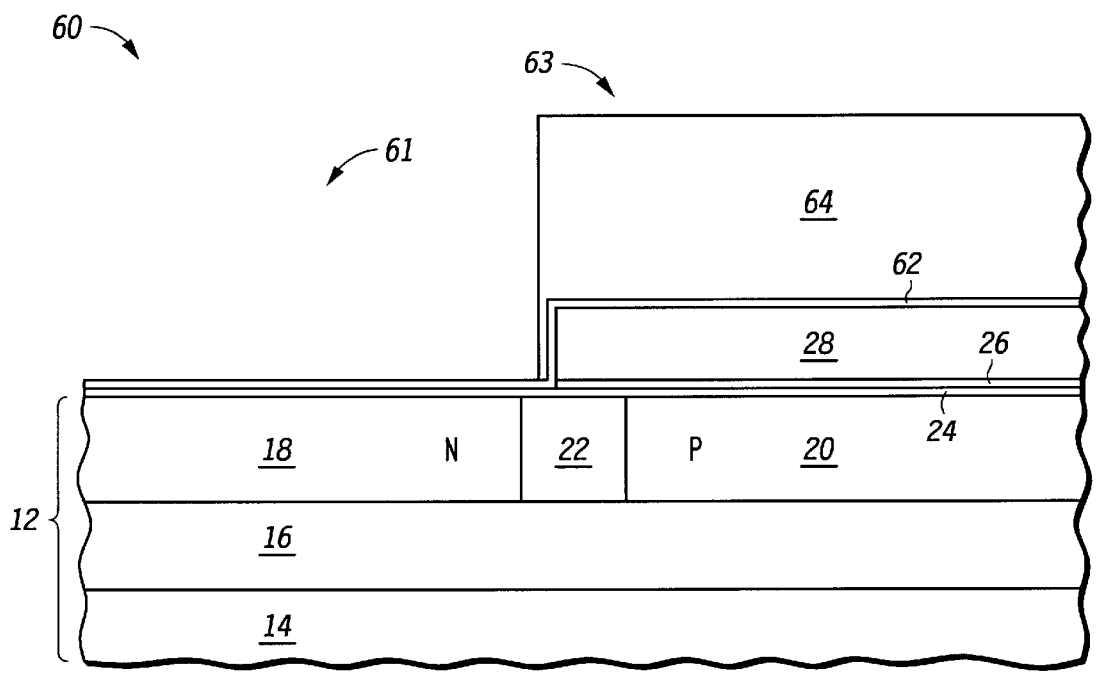
FIGS. 10–13 are cross sections of a semiconductor device according to a second embodiment of the invention at sequential stages in processing.

Shown in FIG. 10 is device 60 after a photoresist layer 64 has been deposited and patterned to expose seed layer 62 over N region 18 and to mask P region 20.

Figure 11:
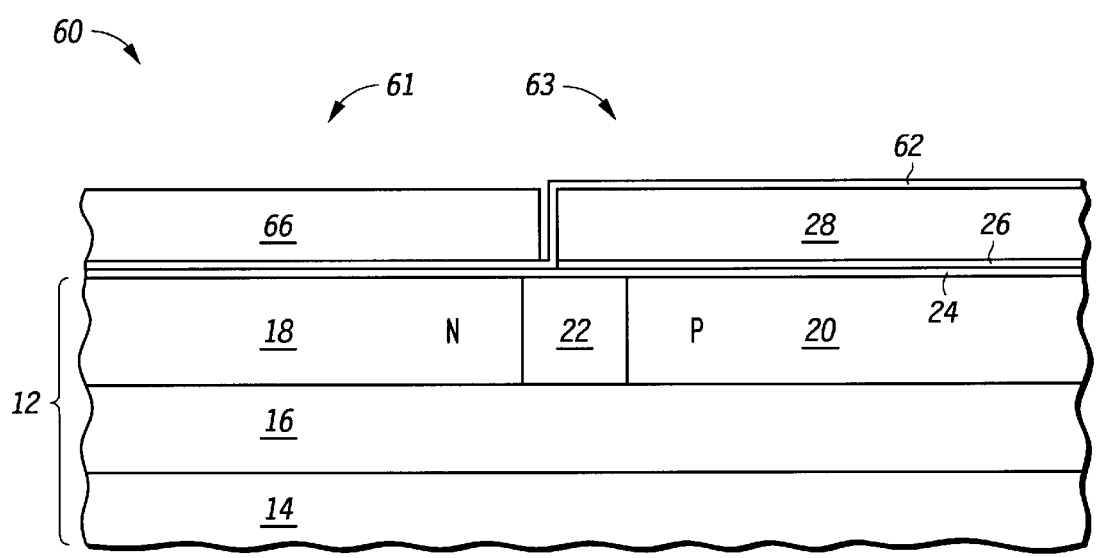

Shown in FIG. 11 is device 60 after plating the exposed portion of seed layer 62 to form plated layer 66 over N region 18 but not over plated layer 28 and the removal of photoresist layer 64. Plated layer 66 is formed to have substantially the same height as seed layer 62 in the area where seed layer is over plated layer 28. As for plated layer 36, the material for plated layer 66 is chosen from the platinum metals to have an appropriate work function for a P channel transistor. The removal of photoresist 64 results in the exposure of seed layer 62 in the area where seed layer 62 is over plated layer 28.

Figure 12:
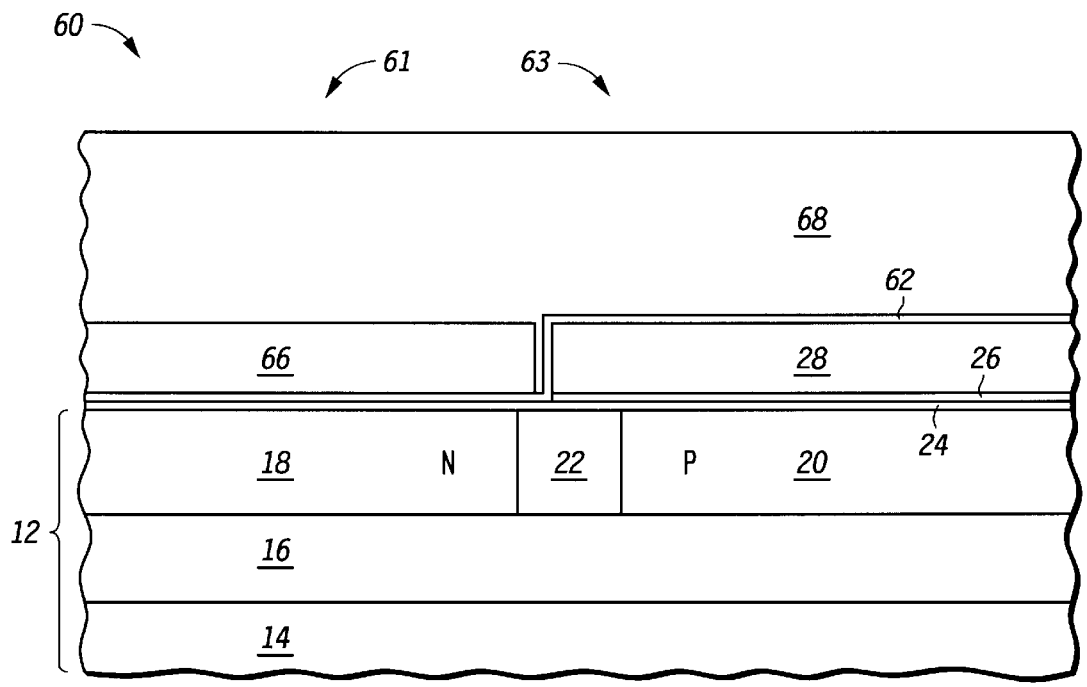

Shown in FIG. 12 is device 60 after deposition of an electrode layer 68 which is analogous to layer 38 of FIG. 5. This is preferably polysilicon which is very conformal in its deposition characteristic. This small gap between plated layers 28 and 66 is easily filled with a substantially planar resulting structure for electrode layer 68.

Figure 13:
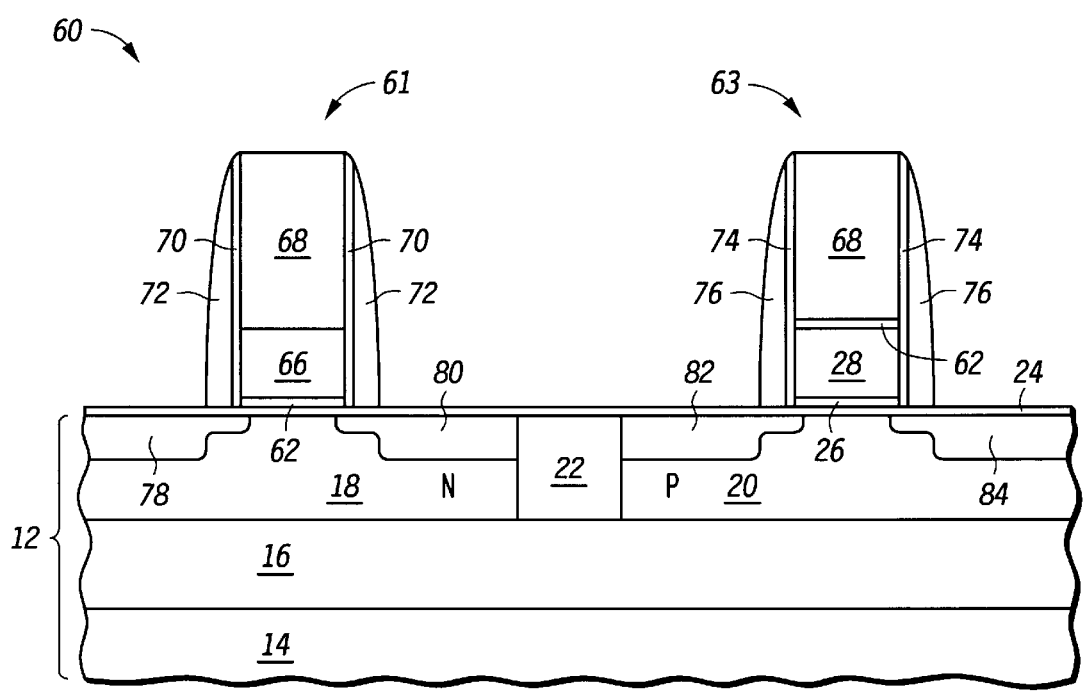

Shown in FIG. 13 are complete P and N channel transistors formed in substantially the same manner as shown for FIG. 8 from FIG. 9. In this case, since there is no extra plated layer in the N channel transistor, there is no need for the planarization step shown from FIG. 6 to FIG. 7. P channel transistor has source/drains 78 and 80, sidewall spacer 72, and liner 70. N channel transistor 68 has source/drains 82 and 84, sidewall spacer 76, and liner 74.

Figure 14:
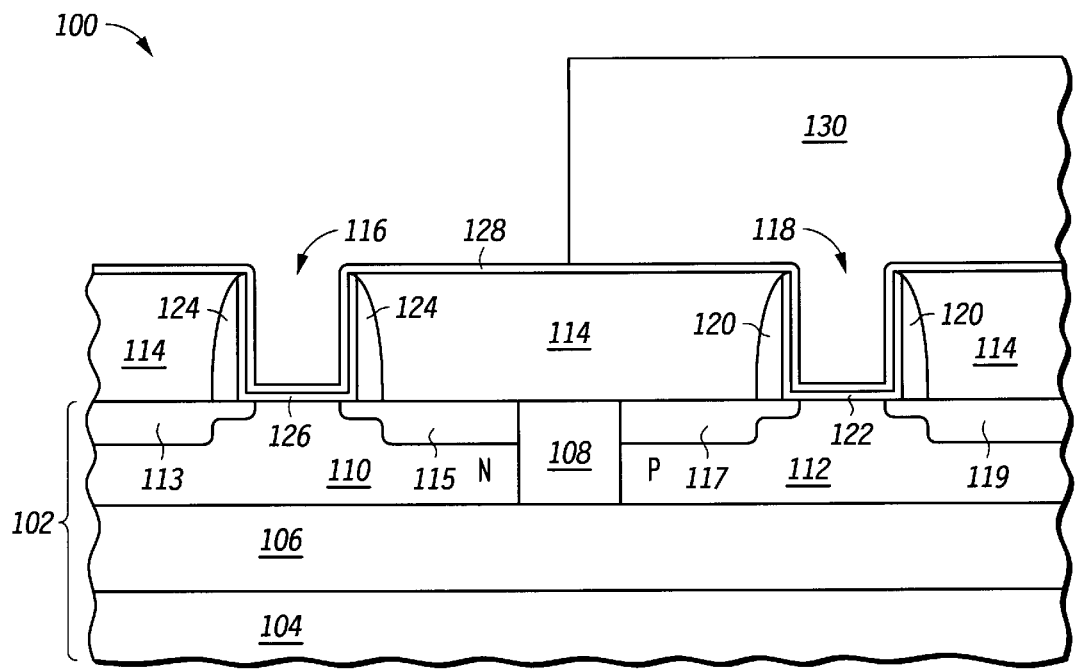
FIGS. 14–17 are cross sections of a semiconductor device according to a third embodiment of the invention at sequential stages in processing.

Shown in FIG. 14 is a device 100 in a replacement gate configuration after formation of source/drains but prior to final gate formation. Device 100 comprises a SOI substrate 102 having a silicon substrate 104, a dielectric layer 106, an N region 110, a P region 112, and an isolation region 108 between N region 110 and P region 112. Device 100 further comprises an interlayer dielectric (ILD) 114 having gate region 116 over N region 110 and gate region 118 over P region 112, a photoresist layer 130 that has been patterned to expose gate region 116 and cover gate region 118. Surrounding and under gate region 116 is gate dielectric 126. Surrounding and under gate region 118 is gate dielectric 122. Also surrounding gate regions 116 and 118 are sidewall spacers 124 and 120, respectively. Sidewall spacers 124 and 120 are between the ILD 114 and the gate dielectric. Device 100 further comprises a seed layer 128 that is formed prior to photoresist layer 130 being formed. The structure under seed layer 128 shown in FIG. 14 is conventional.

Figure 15:
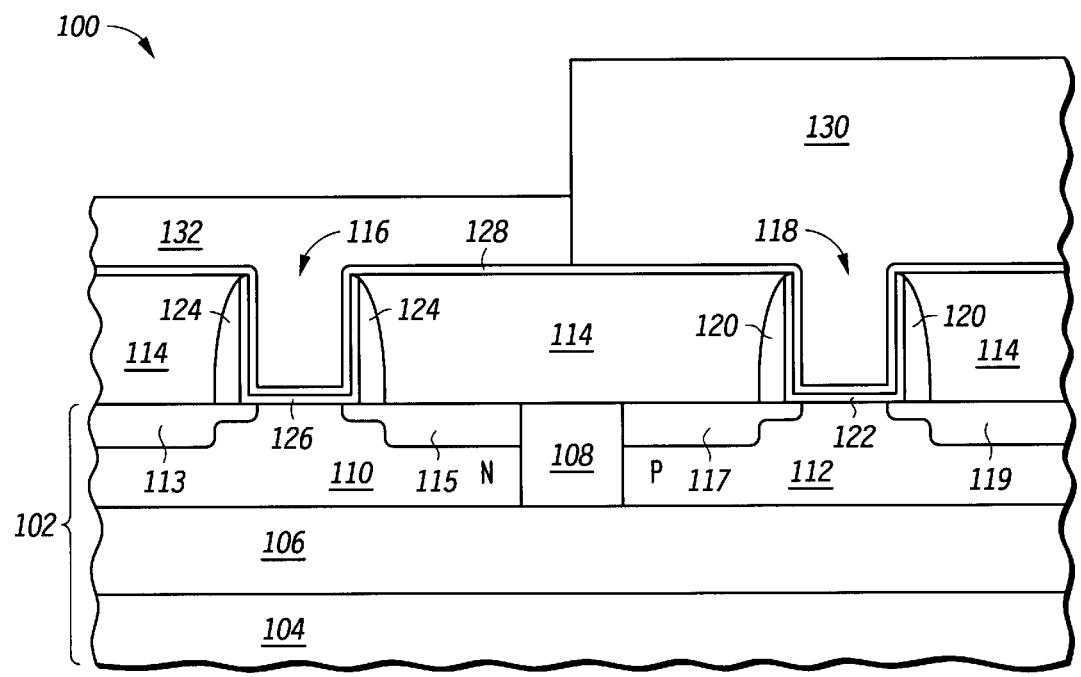

Shown in FIG. 15 is device 100 after plating seed layer 128 to form plated layer 132. Photoresist layer 130, by covering gate region 118, prevents plating on seed layer 128 in gate region 118 during the plating that forms plated layer 132. Plated layer 132 is desirably chosen to be a platinum metal that provides a work function appropriate for a P channel transistor taking into account subsequent doping that occurs to plated layer 132. This doping will vary based on the process that is chosen for processing subsequent to formation of seed layer 132. Seed layer 128 is chosen based on both the material chosen for plated layer 132 and for the material that will be subsequently into gate region 118. Seed layer 128 is preferably a platinum metal deposited by PVD but could be deposited by an alternative method, such as PECVD or CVD.

Figure 16:
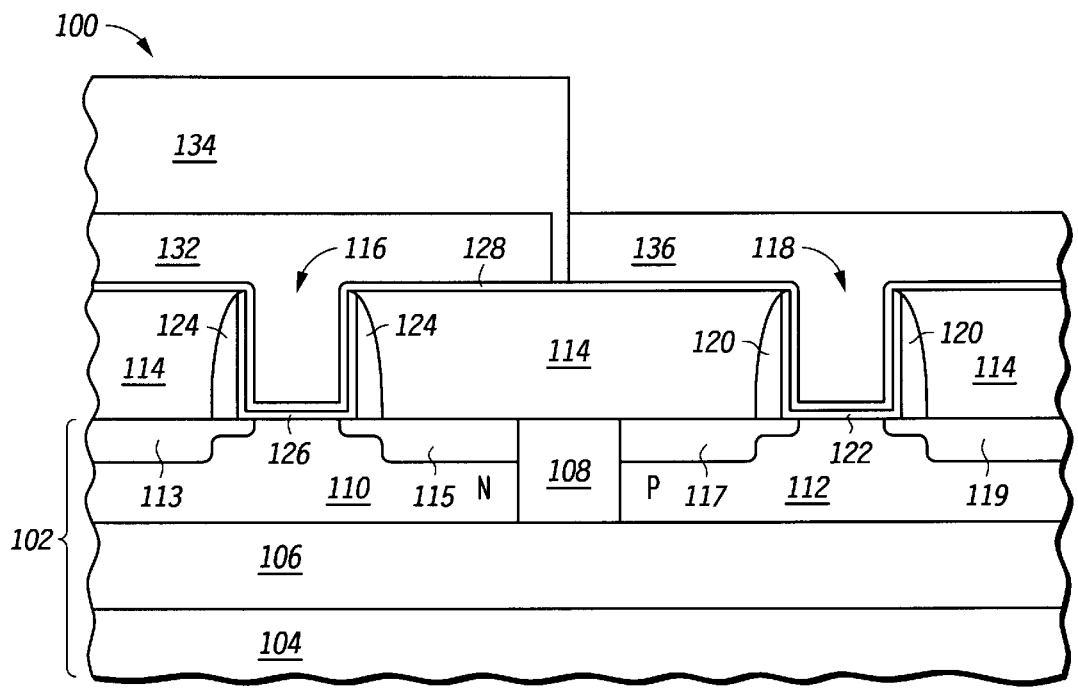

Shown in FIG. 16 is device 100 after removal of photoresist layer 130, formation of patterned photoresist layer 134, and plating to form plated layer 136 in gate region 118. Photoresist layer 134 exposes region 118 while masking plate layer 132. This allows for plated layer 136 to be formed of a different material than plated layer 132. Plated layer 136 is chosen to be a platinum metal with an appropriate work function for an N channel transistor taking into account the subsequent doping of plating layer 136 that occurs in the chosen process. Both plated layers 132 and 136 can be plated by either electroplating or electroless plating. Seed layer 128 extends over the entire device extending to the edge of the wafer on which device 100 resides. Thus, seed layer 128 is available as an electrode for electroplating. Whether electroless plating or electroplating is used, photoresist layer 130 prevents plating in unwanted areas during the plating of the P channel transistor gates and photoresist layer 134 prevents deposition in unwanted areas during the plating of the N channel transistor gates. This is conveniently achieved by using the same seed layer 128 for plating both plated layers 132 and 136. This is effective because both plated layers are platinum metals.

Figure 17:
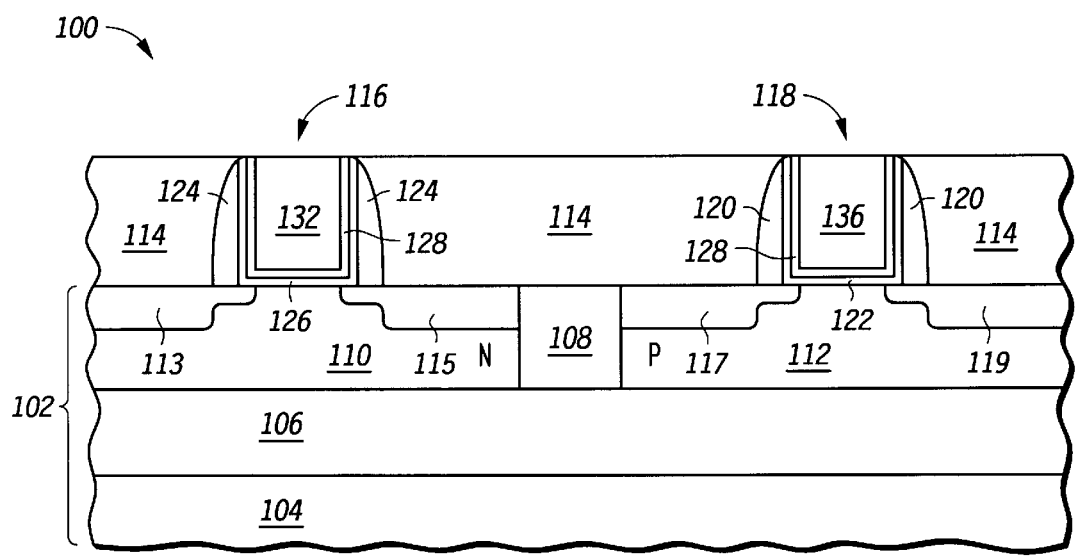

Shown in FIG. 17 is device 100 after removal of photoresist layer 134 and the CMP of plated layers 132 and 136 to leave a completed P channel transistor in and over N region 110 and a completed N channel transistor in and over P region 112.

In the foregoing specification, the invention has been described with reference to specific embodiments, However, one of ordinary skill in the art appreciates that various modifications and changes can be made without departing from the scope of the present invention as set forth in the claims below. For example, in the case of electroless plating, it may be necessary to have additional steps for removing the very thin oxide layer that typically forms on platinum metals. The electroless plating solutions will not typically remove this thin oxide layer and result in poor plating. An alternative is to put down a different metal that does not easily oxidize as an added seed layer. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of providing gates for transistors comprising:
   providing a gate dielectric layer overlying a substrate;
   providing a first seed layer overlying the gate dielectric layer;
   forming a first metal layer having a first work function over said first seed layer by using plating;
   removing a portion of the first metal layer and the first seed layer;
   forming a second seed layer overlying the gate dielectric layer;
   forming a second metal layer having a second work function different from the first work function and over at least a portion of said second seed layer by using plating;
   forming a conductive gate material overlying both the first metal layer and the second metal layer; and
   forming a first gate stack and a second gate stack by removing a portion of each of the conductive gate material, the first metal layer, the second metal layer, the first seed layer and the second seed layer, the first gate stack retaining a first portion of the first seed layer and the second seed layer while the second gate stack retains only a second portion of the first seed layer.

2. The method of claim 1 further comprising:
   forming the first metal layer and the second metal layer by plating a material consisting of a platinum metal, tungsten, ruthenium oxide, a cobalt/tungsten alloy, a nickel/tungsten alloy or a molybdenum/tungsten alloy.

3. The method of claim 1 further comprising:
   forming the first metal layer and the second metal layer by plating a material consisting of at least one refractory metal or lanthanum series metal selected from the group consisting of Zr, Hf, La, Lu, Eu, Pr, Nd, Gd, Dy, alloys or mixtures thereof.

4. The method of claim 1 further comprising:
   plating the first metal layer by electroless plating.

5. The method of claim 1 further comprising:
   plating the first metal layer by electrolytic plating.

6. The method of claim 1 wherein the forming of a second metal layer having a second work function over at least a portion of said second seed layer further comprises:
   forming the second metal layer over all of the second seed layer; and
   removing a portion of the second metal layer and the second seed layer.

7. The method of claim 1 wherein the forming of a second metal layer having a second work function over, at least a portion of said second seed layer further comprises:
   forming the second metal layer over only a portion of the second seed layer by masking off a predetermined portion of the first metal layer.

8. The method of claim 1 further comprising:
   selecting a material for the first seed layer that has a same work function as the first metal layer, thereby resulting in a substantially indistinguishable interface between the first seed layer and the first metal layer.

9. The method of claim 1 further comprising:
   selecting a material for the second seed layer that has a same work function as the second metal layer, thereby resulting in a substantially indistinguishable interface between the second seed layer and the second metal layer.

10. The method of claim 1 further comprising:
    using a same material for the first seed layer and the second seed layer.

11. Transistor gate structures comprising:
    a substrate;
    a gate dielectric layer overlying the substrate;
    a first seed layer overlying the gate dielectric layer within only a first gate stack;
    a first plated metal layer with a first work function and formed within the first gate stack and over said first seed layer;
    a second seed layer formed within both the first gate stack and a second gate stack and overlying the first plated metal layer in the first gate stack and overlying the gate dielectric layer in the second gate stack;
    a second plated metal layer with a second work function which differs from the first work function and formed within both the first gate stack and the second gate stack and overlying the second seed layer; and
    a conductive gate material overlying the second plated metal layer in both the first gate stack and the second gate stack.

12. The transistor gate structures of claim 11 wherein the first plated metal layer and the second plated metal layer are materials consisting of any platinum metal, tungsten, ruthenium oxide, a cobalt/tungsten alloy, a nickel/tungsten alloy or a molybdenum/tungsten alloy.

13. The transistor gate structures of claim 11 wherein the first plated metal layer and the second plated metal layer are materials consisting of a refractory metal or lanthanum series metal selected from the group consisting of Zr, Hf, La, Lu, Eu, Pr, Nd, Gd, Dy, alloys or mixtures thereof.

14. The transistor gate structures of claim 11 wherein the first seed layer has a same work function as the first plated metal layer, thereby resulting in a substantially indistinguishable interface between the first seed layer and the first plated metal layer.

15. The transistor gate structures of claim 11 wherein the second seed layer has a same work function as the second plated metal layer, thereby resulting in a substantially indistinguishable interface between the second seed layer and the second plated metal layer.

16. Transistor gate structures comprising:
   a substrate;
   a gate dielectric layer overlying the substrate;
   a first seed layer overlying the gate dielectric layer within only a first gate stack;
   a first plated metal layer with a first work function and formed within the first gate stack and over said first seed layer;
   a second seed layer formed within both the first gate stack and a second gate stack and overlying the first plated metal layer in the first gate stack and overlying the gate dielectric layer in the second gate stack;
   a second plated metal layer with a second work function and formed only within the second gate stack and overlying the second seed layer; and
   a conductive gate material overlying the second seed layer in the first gate stack and the second plated metal layer in the second gate stack.

17. The transistor gate structures of claim 16 wherein the first plated metal layer and the second plated metal layer are materials consisting of a platinum metal, tungsten, ruthenium oxide, a cobalt/tungsten alloy, a nickel/tungsten alloy or a molybdenum/tungsten alloy.

18. The transistor gate structures of claim 16 wherein the first plated metal layer and the second plated metal layer are materials consisting of a refractory metal or lanthanum series metal selected from the group consisting of Zr, Hf, La, Lu, Eu, Pr, Nd, Gd, Dy, alloys or mixtures thereof.

19. The transistor gate structures of claim 16 wherein the first seed layer has a same work function as the first plated metal layer, thereby resulting in a substantially indistinguishable interface between the first seed layer and the first plated metal layer.

20. The transistor gate structures of claim 16 wherein the second seed layer has a same work function as the second plated metal layer, thereby resulting in a substantially indistinguishable interface between the second seed layer and the second metal layer, but having a distinguishable interface between the second seed layer and the first plated metal layer in the first gate stack.

21. The transistor gate structures of claim 16 wherein the second seed layer has a different work function from the second plated metal layer, thereby resulting in a distinguishable interface between the second seed layer and the second plated metal layer.

22. A method of providing gates for transistors comprising:
   providing a substrate;
   forming a dielectric layer overlying the substrate and having an upper surface, the dielectric layer having a first recessed trench region and a second recessed trench region where gates are subsequently formed;
   forming a seed layer overlying the dielectric layer and within the first recessed trench region and the second recessed trench region;
   masking a portion of the seed layer overlying the first recessed trench region;
   forming a first metal layer overlying a first unmasked portion of the seed layer to fill the second recessed trench with a first metal having a first work function, said first metal layer being formed by plating;
   masking the first metal layer;
   forming a second metal layer overlying a second unmasked portion of the seed layer to fill the first recessed trench with a second metal having a second work function different from the first work function, said second metal layer being formed by plating; and
   removing all material above the upper surface of the dielectric layer while retaining metal within each of the first recessed trench and the second recessed trench.

23. The method of claim 22 further comprising:
   forming the first metal layer and the second metal layer by plating a material consisting of: any platinum metal, tungsten, ruthenium oxide, a cobalt/tungsten alloy, a nickel/tungsten alloy or a molybdenum/tungsten alloy.

24. The method of claim 22 further comprising:
   forming the first metal layer and the second metal layer by plating a material consisting of at least one refractory metal or lanthanum series metal selected from the group consisting of Zr, Hf, La, Lu, Eu, Pr, Nd, Gd, Dy, alloys or mixtures thereof.

25. The method of claim 22 wherein the forming of the seed layer further comprises depositing the seed layer by either vapor deposition or atomic layer deposition suitable for electrolytic deposition of at least one of the first metal layer and the second metal layer.

26. The method of claim 22 wherein the forming of the seed layer further comprises forming a catalytic layer suitable for electroless deposition of the first metal layer and the second metal layer.

27. Transistor gate structures comprising:
   a substrate;
   a gate dielectric layer overlying the substrate, the gate dielectric layer having a first recessed trench region and a second recessed trench region;
   a metallic seed layer overlying the dielectric layer and within the first recessed trench region and the second recessed trench region;
   a first plated metal layer within the second recessed trench formed of a first metal having a first work function; and
   a second plated metal layer within the first recessed trench formed of a second metal having a second work function different from the first work function.

28. The transistor gate structures of claim 27 wherein the first plated metal layer and the second plated metal layer are materials consisting of a platinum metal, tungsten, ruthenium oxide, a cobalt/tungsten alloy, a nickel/tungsten alloy or a molybdenun/tungsten alloy.

29. The transistor gate structures of claim 27 wherein the first plated metal layer and the second plated metal layer are materials consisting of a refractory metal or lanthanum series metal selected from the group consisting of Zr, Hf, La, Lu, Eu, Pr, Nd, Gd, Dy, alloys or mixtures thereof.

30. The transistor gate structures of claim 27 further comprising:
   sidewall spacers within the gate dielectric layer and surrounding the first recessed trench region and the second recessed trench region; and
   source /drain regions formed within the substrate underlying and surrounding the first recessed trench region and the second recess trench region.

* * * * *

UNITED STATES PATENT AND TRADEMARK OFFICE
CERTIFICATE OF CORRECTION

PATENT NO. : 6,686,282 B1 Page 1 of 1
DATED : February 3, 2004
INVENTOR(S) : Simpson et al.

It is certified that error appears in the above-identified patent and that said Letters Patent is hereby corrected as shown below:

Column 6,
Line 16, change "over," to -- over --.

Signed and Sealed this

Twenty-fifth Day of May, 2004

JON W. DUDAS
*Acting Director of the United States Patent and Trademark Office*